United States Patent [19]
Myers

[11] Patent Number: 6,163,209
[45] Date of Patent: Dec. 19, 2000

[54] DEMODULATION OF ANGLE MODULATED CARRIERS USING A NONCOHERENT REFERENCE

[76] Inventor: Glen A. Myers, 279 Laureles Grade Rd., Salinas, Calif. 93908

[21] Appl. No.: 09/215,684

[22] Filed: Dec. 17, 1998

[51] Int. Cl.[7] .............................. H03D 3/00; H04L 27/14

[52] U.S. Cl. ......................... 329/316; 329/315; 329/341; 375/322; 375/324; 375/326; 455/205; 455/214; 455/337

[58] Field of Search ..................................... 329/300, 321, 329/341, 315, 316, 345; 375/326, 324, 322; 455/205, 337, 214

[56] References Cited

U.S. PATENT DOCUMENTS

5,329,242  7/1994  Myers ...................................... 329/300

*Primary Examiner*—Arnold Kinkead
*Attorney, Agent, or Firm*—Patrick T. King

[57] ABSTRACT

A technique for demodulating a message signal from an angle modulated carrier signal. A noncoherent, independent, periodic reference is generated to have a predetermined phase characteristic and which is noncoherent with and independent of the angle modulated carrier signal. The phase of the reference is then compared with the phase of the carrier to determine the message signal on the angle modulated carrier. The phase of the noncoherent, independent, periodic reference is associated with a measured value for the reference. The phase of the angle modulated carrier signal is associated with a voltage value for the angle modulated carrier signal. These values are measured and then compared to determine the message signal on the modulated carrier signal. Time variations of the comparison of values are directly related to the message signal in the case of a PM carrier. Changes in the time variations of the voltage comparison are related to the message signal for a FM carrier. A sawtooth variation is used as the reference and is generated with a clock and counter. Zero values of the angle modulated signal load the counter value into a storage register or a processor to create a measurement of the phase difference between the reference and the angle modulated signal.

40 Claims, 8 Drawing Sheets

DEMODULATION OF ANGLE MODULATED CARRIERS USING A NONCOHERENT REFERENCE

BACKGROUND OF THE INVENTION

1. Field of the Invention

The present invention generally relates to the recovery of messages from an angle modulated carrier consisting of either frequency modulation (FM) of a carrier signal or phase modulation (PM) of a carrier signal.

A modulated sinusoidal carrier is used to transfer messages in radio and telecommunication systems. The message in modern systems causes either the frequency, using FM, or the phase, using PM, of the carrier to vary in accordance with the amplitude (voltage) of the message signal. In the case of analog messages, such as voice in Advanced Mobile Phone Systems (AMPS) cellular systems, for example, the preferred choice of modulation at present is FM. Digital messages, used in digital cellular systems and for computer communications, are commonly carried by some form of PM or by FM on occasion.

Recovery of the message from a modulated carrier in the case of FM is accomplished with an analog circuit such as a phase locked loop or a quadrature demodulator. Demodulation of PM carriers involves the recovery of bit streams since analog messages are not transferred using PM. Such PM demodulation requires a coherent reference signal. Typically, the PM carrier is separated into in-phase and quadrature components and these components are demodulated separately by multiplying each of these components by a coherent reference signal with subsequent lowpass filtering of each multiplier output. The coherent reference must either be derived from the received modulated carrier, or be obtained by trial and error or by a search routine.

A present trend is to replace many of the analog operations of a receiver, including demodulation, with digital circuitry. Use of digital circuitry provides design flexibility because changes in circuitry operation can be made with code changes without changing hardware. Realizing operation of phase locked loops as demodulators or realizing operation of quadrature demodulators with digital circuitry is difficult because of the large number of digital operations and the large amount of memory required. Similarly, the large number of multiplication and filtering functions needed in coherent demodulation of PM carriers requires involved digital circuitry and code, both of which compromise the speed of processing. Therefore, there is a need to develop methods and apparatus that permit demodulation of either FM or PM carriers with simple digital circuitry and without the need for a coherent reference.

2. Prior Art

U.S. Pat. Nos. 4,859,958 and 4,992,747, invented by Glen A. Myers, the inventor of the present invention, are each incorporated by reference in the present application as though fully set forth herein. In these patents, a means for demodulating all of several co-channel FM carriers is described.

U.S. Pat. No. 5,038,115, co-invented by the inventor of the present invention, is also incorporated by reference in the present application as though fully set forth herein. In this patent, phase tracking of input terminal signals is described. In one embodiment of the phase tracking circuit of U.S. Pat. No. 5,038,115, a phase tracking circuit makes use of two phase-locked loops electrically connected in a feed forward manner.

U.S. Pat. No. 5,329,242 invented by the inventor of the present invention, is also incorporated by reference as though fully set forth herein. In this patent, demodulating a frequency modulated signal using the time intervals between zero crossings of a received carrier signal is described. Averaging and mapping techniques are used to improve estimates of the message signal.

U.S. Pat. Nos. 5,541,959 and 5,570,395, invented by the inventor of the present invention, are also incorporated by reference as though fully set forth herein. These patents describe, analytically and geometrically, the effect of adding two sinusoids of different frequency.

U.S. Pat. No. 5,606,581, invented by the inventor of the present invention is also incorporated by reference as though fully set forth herein. This application described a method and apparatus for creating a replica of a dominant carrier.

U.S. Pat. No. 5,554,955, invented by the inventor of the present invention, is also incorporated by reference as though fully set forth herein. This patent describes a method and apparatus for removing the effects of co-channel interference from the message on a dominant frequency modulated carrier and for recovering the message from each of two co-channel carriers.

U.S. patent application Ser. No. 08/705,721 now U.S. Pat. No. 5,878,084 by the inventor of the present invention is also incorporated by reference as though fully set forth herein. This application describes a method and apparatus for recovering the independent bit streams from each of two co-channel frequency modulated carriers.

U.S. patent application Ser. No. 08/870,469 now U.S. Pat. No. 5,878,084 by the inventor of the present invention is also incorporated by reference as though fully set forth herein. This application describes a method and apparatus for transferring two or more independent bit streams using each of two co-channel frequency modulated carriers.

U.S. patent application Ser. No. 09/045,225 by the inventor of the present invention is also incorporated by reference as though fully set forth herein. This application describes a method and apparatus for using feature characteristics including times of occurrence to represent independent bit streams or groups of bits in data transmission systems.

SUMMARY OF THE INVENTION

In the demodulation technique which is the subject of this invention, a sample of the phase of the modulated carrier is compared with a sample of the phase of the periodic reference. Since the phase of the periodic reference is predictable (known), then any variation of the comparison from sample to sample is due either to a difference in frequency of the reference and the unmodulated carrier or to the modulation of the received carrier. The variation due to the difference in frequency is known and separable. The remaining variation of the phase comparison from sample to sample is linearly related to the message on the carrier in the case of PM. The change in the remaining variation of the phase comparison between adjacent samples is linearly related to the message on the carrier in the case of FM.

Holding the sampled values of relative phase and lowpass filtering the discrete phase comparison results provides the continuous result of interest in the case of analog messages. Identifying message transitions and mapping the phase comparison results to two values (two-level voltage) provides the desired bit stream in the case of digital messages.

Practically, a sample value of phase is not obtained. Rather, a sample of voltage is obtained. The sinusoidal nature of the modulated carrier provides a known relationship between voltage and phase. Similarly, any periodic reference will have a defined phase. Samples of phase can be obtained from samples of voltage for the modulated carrier and from samples of the periodic reference.

The present invention provides a method of demodulating an angle modulated carrier signal which is angle modulated with a message signal. A noncoherent, independent, periodic reference is generated and has a predetermined phase characteristic which is noncoherent with and independent of the phase of the angle modulated carrier signal. The method includes the steps of determining the phase of the noncoherent, independent, periodic reference and determining the phase of the angle modulated carrier signal. These two phases are then compared to determine the message signal on the angle modulated carrier signal.

The step of determining the phase of the noncoherent, independent, periodic reference includes associating the phase of the noncoherent, independent, periodic reference with a measured value of the noncoherent, independent, periodic reference and the step of determining the phase of the angle modulated carrier signal includes associating the phase of the angle modulated carrier signal with a voltage value for the angle modulated carrier signal. The method then includes measuring the value of the modulated carrier signal, measuring the value of the independent periodic reference, and comparing the measured value of voltage of the modulated carrier signal with the measured value of the independent periodic reference to determine the message signal on the modulated carrier signal, such that the time variations of said voltage comparison are directly related to the message signal in the case of a PM carrier signal and such that changes in the time variations of the voltage comparison are related to the message signal for a FM carrier.

The noncoherent, independent, periodic reference is generated with an oscillator which is not synchronized with the angle modulated carrier signal. One preferred embodiment of the invention provides the noncoherent, independent, periodic reference as a sawtooth variation having a predetermined phase characteristic which is noncoherent with and independent of the phase of the angle modulated carrier signal.

In a preferred embodiment of the invention the phase of the angle modulated carrier is determined every M cycles of the angle modulated carrier signal.

A sawtooth variation for use as a noncoherent, periodic, reference is generated by counting clock pulses and interpreting the count value as levels of the sawtooth variation.

A feature is any characteristic of an angled modulated carrier that occurs once each cycle of the carrier. A feature is, for example, the maximum, minimum, or zero value of the angled modulated carrier.

A feature of the angle modulated carrier is associated with the phase of the angle modulated carrier. A feature detector is used to recognize the time occurrence of the feature. The time occurrence of the feature is used to determine the phase of the noncoherent, independent, periodic reference at that time. Knowledge of the phase of the angle modulated carrier at the time of occurrence of the feature coupled with the reading of the phase of the noncoherent, independent, periodic reference permits a phase comparison whenever the feature occurs.

In a preferred embodiment of the invention, particular zero values of the angle modulated carrier are identified as the feature of the angle modulated carrier.

The angle-modulated carrier signal is converted to a form where its zero values are readily identified and the value of the independent, periodic reference is measured at the occurrences of the zero values of the modulated carrier signal. One such form of the angle-modulated signal where its zero values are readily identified is obtained by hard limiting the modulated carrier to provide a modulated two-level voltage signal. The zero values of said modulated two-level voltage signal are then detected, for example, with an astable multivibrator, or one-shot, to obtain the occurrences of the zero values of the modulated carrier signal.

One preferred embodiment of the invention includes counting pulses of a clock signal and interpreting the count value as discrete levels of a sawtooth variation. The sawtooth variation can be obtained with a processor or by transferring the counts of the reference clock signal to a digital-to-analog converter using the output signal of the astable multivibrator.

In one embodiment of the invention, the phase of the angled modulated carrier signal is obtained every M cycles of the angle modulated carrier signal, where M is an integer equal to or greater than 1.

The invention also provides a system for recovering a message signal from an angle modulated carrier signal. The system includes a feature detector. The system includes a noncoherent reference generator having as output a noncoherent, independent, periodic reference having a predetermined phase characteristic, which is noncoherent with and independent of the phase of the angle modulated carrier signal. A processor compares the phase of the angle modulated carrier signal with the phase of the noncoherent, independent, periodic reference to provide the message signal on the angle modulated carrier signal.

For PM, the processor provides time variations which are related to the message signal for a PM carrier. For FM, the processor provides changes in time variations which are related to the message signal for a FM carrier.

A hard limiter receives the angle modulated carrier signal and provides a hard limited signal to the divide-by-M circuit. The divide-by-M circuit is coupled to the output terminal of the hard limiter and has an output terminal coupled to the input terminal of the astable multivibrator. An input terminal of the astable multivibrator is coupled to the output of the divide-by-M circuit to provide a signal which has a transient binary state corresponding to zero values of the angle modulated carrier. The hard limiter, divide-by-M circuit and astable multivibrator comprise a feature detector.

A counter provides a digital representation of the number of cycles of the reference clock counted by the counter. The reference clock and counter comprise the reference generator.

The output pulses of the astable multivibrator transfer the counter contents to a processor. The processor receives the contents of the counter and converts the contents to a voltage. The time variation of this voltage is linearly related to samples of the message in the case of PM carriers. Differences in the time variation of this voltage from sample to sample is linearly related to samples of the message in the case of FM carriers.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Angle modulation of a carrier includes PM and FM. In the general case, the form of the carrier $v_C(t)$, the phase of which is modulated by a phase function $\theta(t)$ is $$v_C(t) = A \cos[2\pi f_C t + \theta(t)]$$

where:

A=a constant which is the peak value of the carrier, $f_C$=a constant which is the frequency of the unmodulated carrier, $\theta(t)$=a phase function which is $k_P \cdot m(t)$ for the case of PM, $k_P$=a modulation constant having units of radians per volt, m(t)=a message voltage, $\theta(t)$=the phase function which is $k_F \int m(t)dt$ for the case of FM, and $k_F$=a modulation constant having units of Hertz per volt.

In the case of PM or FM, the phase function $\theta(t)$, argument or angle of the carrier is caused to change by the message voltage. Measuring the time variation of the phase gives the message directly in the case of a PM carrier. Measuring the time rate of change (i.e., the derivative) of the time variation of phase gives the message in the case of a FM carrier. Consequently, measurement of the phase of a modulated carrier is used to recover the message from either a PM carrier or a FM carrier.

Figure 1:
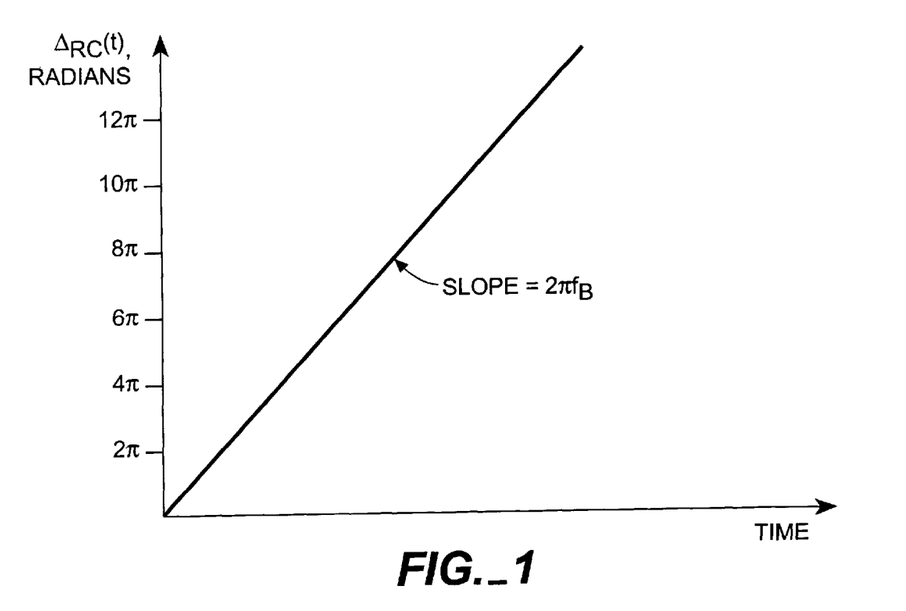
FIG. 1 is a plot of the time variation of phase difference of an unmodulated carrier and a periodic reference when the difference in frequency of the carrier and reference is $f_B$ Hz.

The notion of a periodic reference signal having a fixed frequency $f_R$ Hz is introduced, where $$f_R = f_C - f_B$$

and $f_B$ is a difference or "beat" frequency between the carrier signal and the reference signal. Now, as time progresses, the change in phase $\Delta_{RC}(t)$ of an unmodulated carrier relative to that of the reference signal is $2\pi f_B t$. This change in phase $\Delta_{RC}(t)$ phase is plotted in FIG. 1 when $f_B > 0$. The slope of the plot is $2\pi f_B$. When $f_B < 0$, the slope of the plot of FIG. 1 is negative.

When the carrier is phase modulated, the change in phase of the modulated carrier relative to that of the reference signal is $$\Delta_{RC}(t) = 2\pi f_B t - \theta(t).$$

So to demodulate the carrier, it is only necessary to measure the relative phase $\Delta_{RC}(t)$ and subtract the linear time variation $2\pi f_B t$ to obtain $\theta(t)$.

Figure 2:
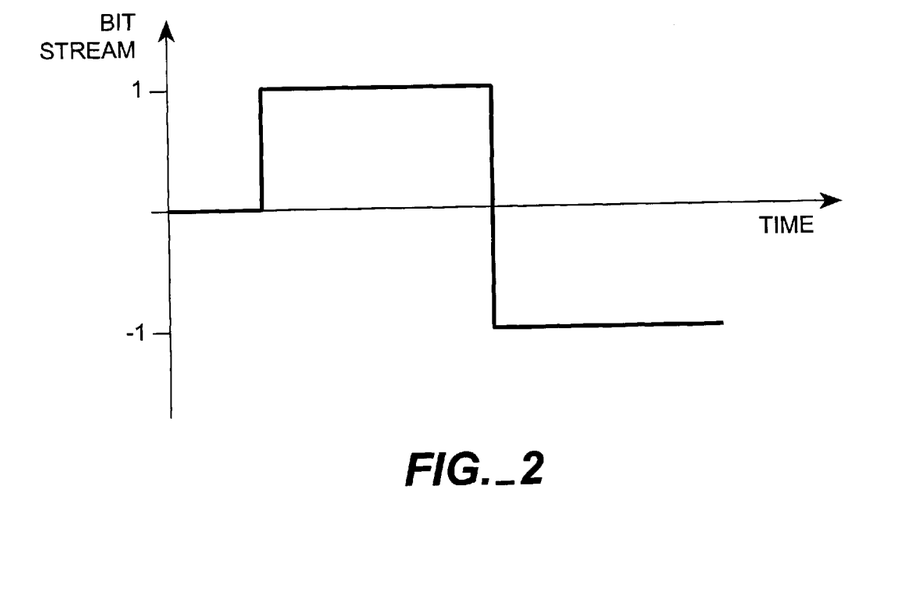
FIG. 2 is an example of two bits which are adjacent in time and which form part of a bit stream.
Figure 3A:
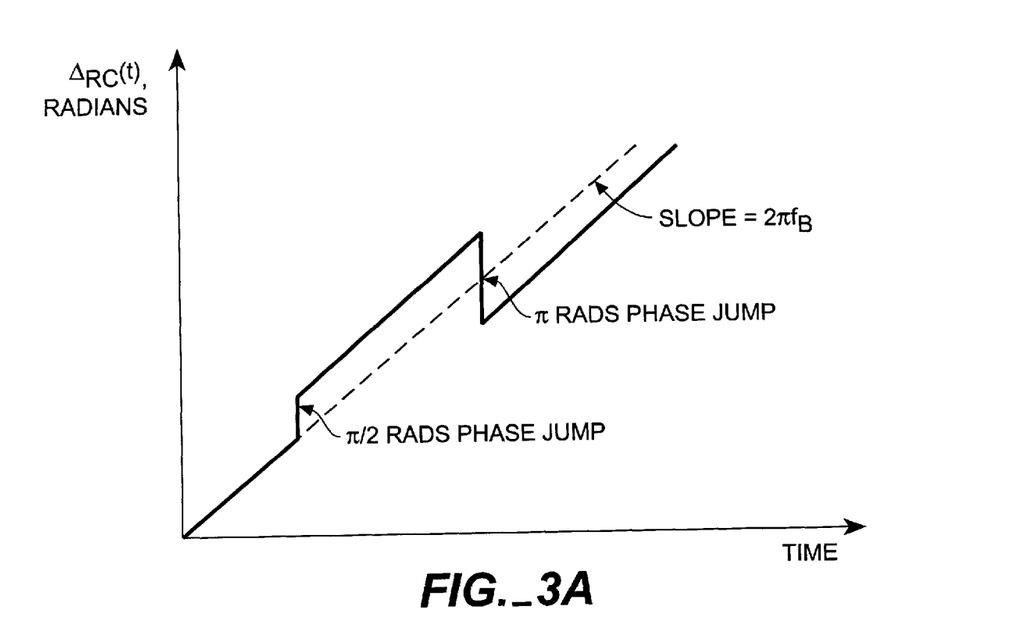
FIG. 3A is the time variation of phase difference of a carrier phase modulated by the two bits of FIG. 2 and a periodic reference when the difference in frequency of the carrier and reference is $f_B$ Hz.
Figure 3B:
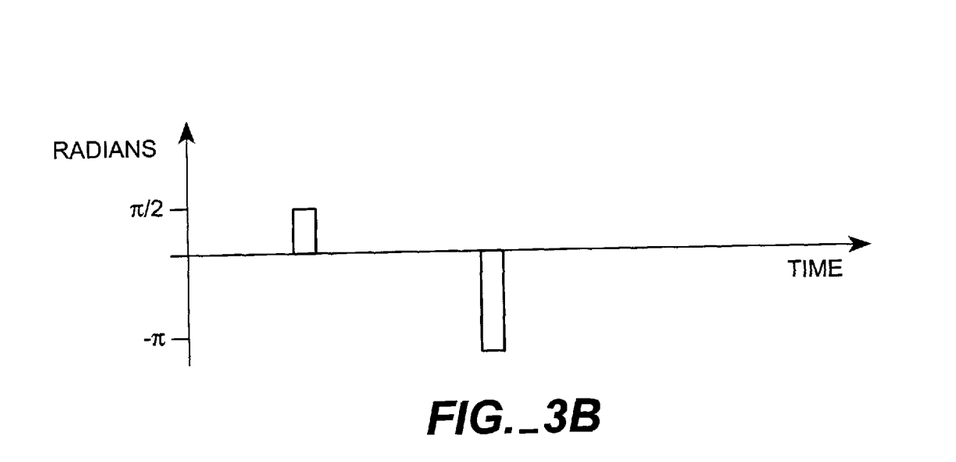
FIG. 3B is the difference in relative phase between adjacent sample values for the phase variation of FIG. 3A.

FIG. 2 shows an exemplary bit stream. FIG. 3A shows the variation of $\Delta_{RC}(t)$ for the case of PM (using binary phase shift keying BPSK) by the exemplary bit stream of FIG. 2. In FIG. 3A, it is assumed that the phase function $\theta(t)$ has possible values equal $\pm\pi/2$ radians. FIG. 3B shows the difference in relative phase between samples adjacent in time.

It is common practice to use peak phase excursions of $\theta(t)$ equal $\pm\pi/2$ for the case of BPSK modulation and $\pm\pi/2$ and $\pi$ for the case of quadrature phase shift keying (QPSK) modulation. These peak phase excursion values are chosen because of orthogonality requirements when using a coherent phase reference signal for coherent demodulation of a PM carrier. Such peak phase excursion values are not required when using a noncoherent phase reference signal. Use of smaller values of peak phase excursion when the message is a bit stream results in reduced power in adjacent frequency bands.

When the carrier signal is frequency modulated, then $$\Delta_{RC}(t) = 2\pi f_B t + k_F \int m(t) dt.$$

Figure 4A:
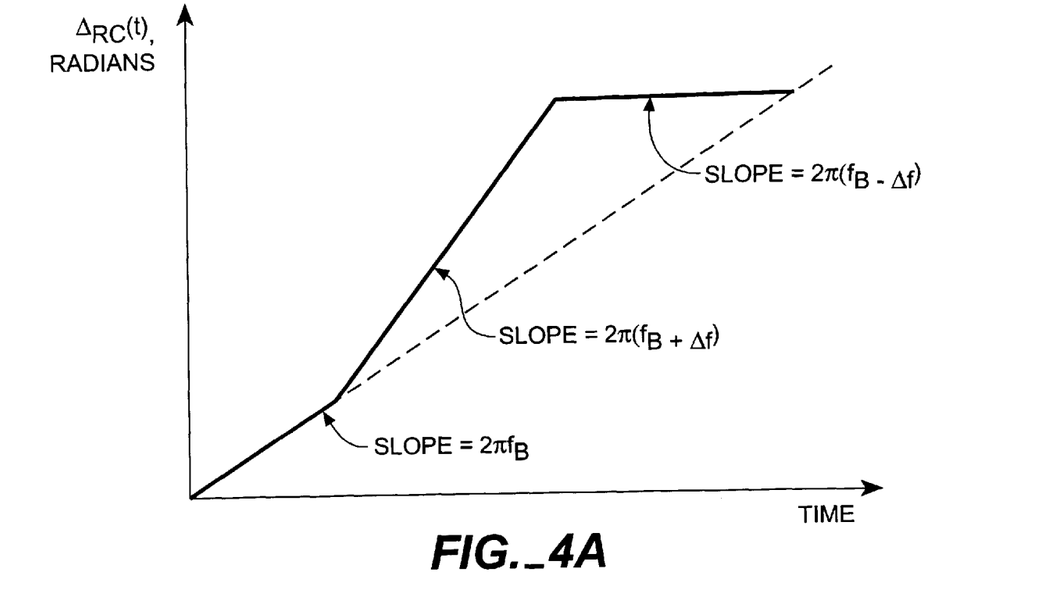
FIG. 4A is the time variation of phase difference of a carrier frequency modulated by the two bits of FIG. 2 and a periodic reference when the difference in frequency of the carrier and reference is $f_B$ Hz.
Figure 4B:
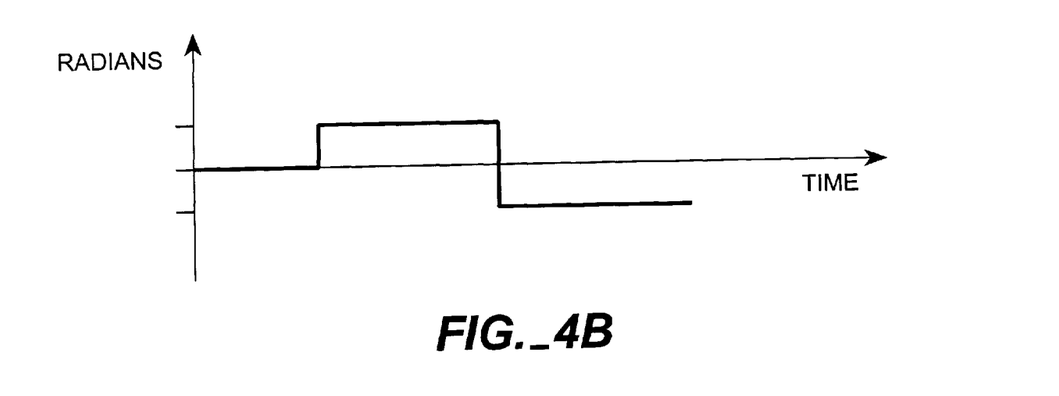
FIG. 4B is the difference in relative phase between adjacent sample values for the phase variation of FIG. 4A.

FIG. 4A shows the variation of $\Delta_{RC}(t)$ for the case of FM (frequency shift keying FSK) by the two bits of FIG. 2. Note the change in slope of $\Delta_{RC}(t)$ with the state of the bit stream. For unshaped (rectangular) bits with carrier peak frequency deviations of $\pm\Delta f$ Hz, the slope of $\Delta_{RC}(t)$ becomes $2\pi(f_B \pm \Delta f)t$ as shown in FIG. 4A. FIG. 4B shows the difference in relative phase between samples adjacent in time.

This invention uses a periodic reference to recover a message from a FM or PM carrier. The periodic reference is used to map each value of phase in a range of 360 degrees to an appropriate known value of the reference. Knowledge of the value of the periodic reference at an instant of time is equivalent to a phase value at that instant of time by virtue of the mapping. Any periodic reference that maps phase to a known reference value during each period of the reference can be used. One example of a known value is the state of a digital circuit such as a counter. Another example of a known condition is a voltage variation. Examples of periodic reference voltages are sinusoids, triangular variations, sawtooth variations, etc.

The modulated carrier signal experiences phase variations with time which are due to the carrier frequency as well as the FM or PM of the carrier by the message signal being transferred. An instantaneous period of the modulated carrier signal is defined as the time between voltage values of like amplitude and slope. The instantaneous period varies with time because of the modulation imposed on the carrier signal. The duration of the instantaneous period is associated with an excursion of 360 degrees of the modulated carrier signal. The form of the carrier signal provides a relation between its phase and a voltage value of the carrier signal.

A sample of the periodic reference at an instant of time provides an indication of its phase because of the known mapping of phase to reference value. Likewise, a voltage sample of the modulated carrier at the same instant of time provides an indication of its phase. The phase variation of the periodic reference is known in advance because of the known repeating structure of the periodic reference. Any change in phase of the modulated carrier signal relative to the phase of the periodic reference is due to the frequency difference of the carrier and the reference and due to the angle modulation of the carrier signal. The relative phase due to frequency difference experiences a linear variation with time and this known relation is used to remove the frequency difference component of phase variation. What remains is the phase variation due to the modulation signal. In this manner, demodulation of FM or PM carriers is achieved through use of the periodic reference of known structure.

Figure 5A:
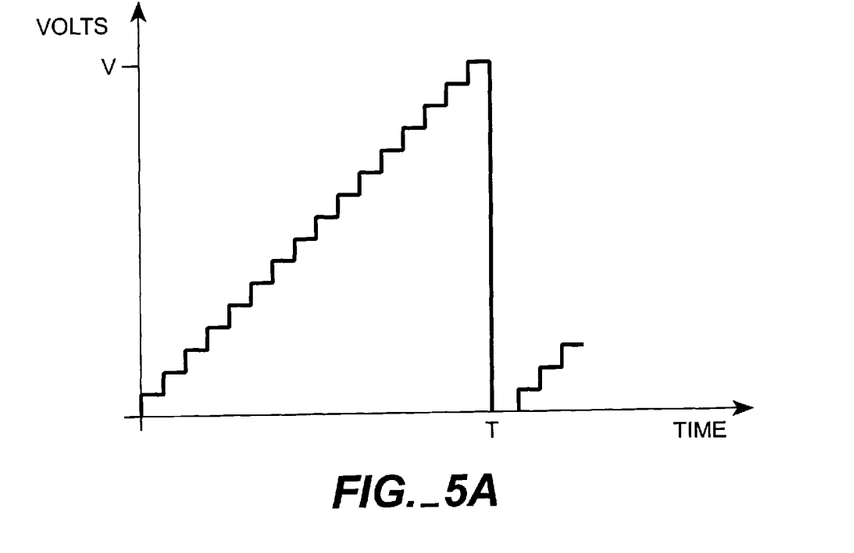
FIG. 5A is an example of the output signal of a digital circuit used to generate a sawtooth voltage having discrete steps.

In one preferred embodiment of this invention, a particularly convenient periodic reference is used to map phase to a value of the reference. This particularly convenient periodic reference is a sawtooth variation shown in discrete voltage form in FIG. 5A. There are a variety of known analog techniques which can be used to generate a sawtooth voltage.

Figure 5B:
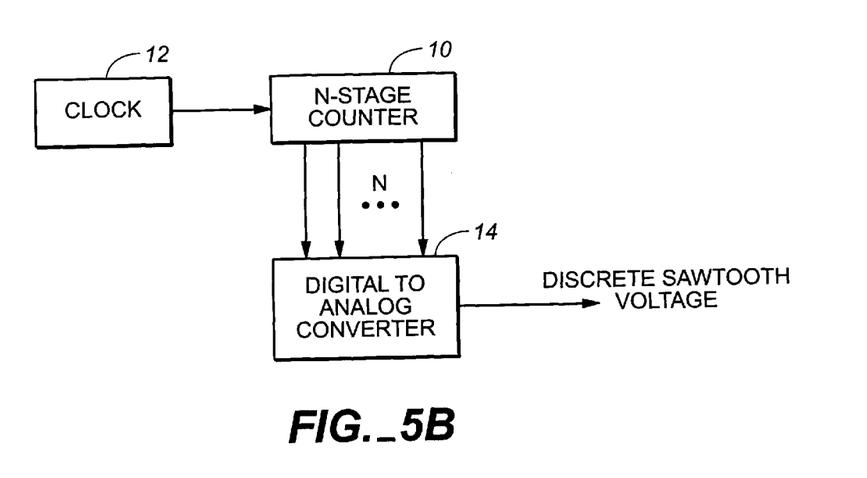
FIG. 5B is a block diagram of a digital circuit used to generate a sawtooth voltage having discrete steps.

A direct means of digitally generating such a sawtooth variation is by use of a counter 10 having N stages as shown in FIG. 5B. The input signal to the counter 10 is the output signal of a clock source 12. The output signals of the counter 10 represent the sawtooth variation. The sawtooth variation can be converted to a voltage by means of a D to A converter 14. After digital-to-analog (D/A) conversion, an output signal is provided which has a voltage amplitude proportional to the number of clock pulses counted. The counter overflows from a count of $2^N-1$ to a count of zero. This creates the flyback portion of the sawtooth voltage signal. The step size in the discrete sawtooth voltage signal is $V/2^N$ volts where V is the peak voltage level out of the D/A converter. For example, when N=8 stages and V=5 volts, then the step size is 5/256=19.5 mv. In this case, 256 steps are mapped to 360 degrees and so each step represents 1.41 degrees of phase. Since the phase of the sawtooth voltage is linearly related to the signal voltage value, then a sample value of the voltage is directly and simply related to the phase of the periodic reference signal. It is not necessary to convert the counter contents to a sawtooth voltage. A processor can be used to accept the counter outputs and associate the contents of the counter with an appropriate value of phase of the reference.

Demodulation of the modulated carrier signal by using a reference involves the notion of relative phase of the carrier and the reference. The concept of relative phase allows the use of either the modulated carrier signal or the reference as the standard of comparison. In a preferred embodiment of the invention, sampling (and hence phase determination by virtue of the mapping) of the periodic reference is done at a particular value of phase of the modulated carrier signal. The chosen phase of the modulated carrier signal is 0 degrees (360 degrees) which corresponds to every other zero value of the modulated carrier. The sampling time is conveniently determined by hard limiting the received, modulated sinusoidal carrier signal. The interval between samples is not constant because of the FM or PM of the carrier signal. Consequently, when $f_B=0$, the phase of the periodic sawtooth at the sampling time either increases or decreases from sample to sample. In voltage form the sawtooth sample values appear to walk up or down the sawtooth staircase signal of FIG. 5B. Because of the linear mapping of a phase to voltage in this example, the relative phase values similarly increase or decrease. This increase or decrease (walking) is a measure of the change in phase between like zero values of the hard limited, modulated carrier signal. This change is phase is caused by the modulation signal. In this manner, the PM of the modulated carrier is determined using all digital circuitry and waveforms.

Figure 6A:
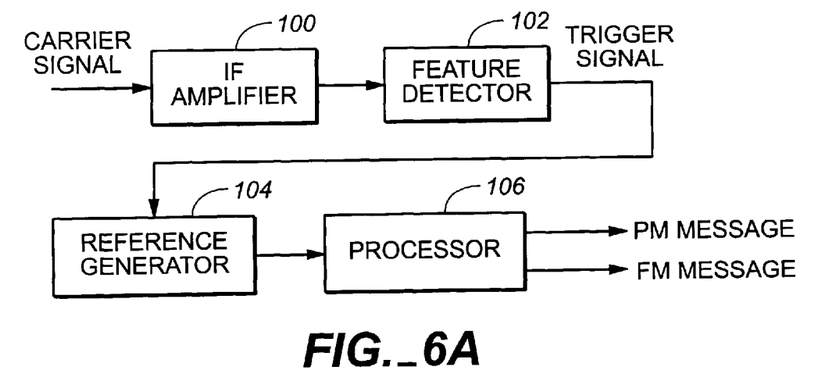
FIG. 6A is a block diagram of an angle demodulator which uses a noncoherent, independent, periodic reference and which is suitable for recovery of the message for a frequency modulated carrier and a phase modulated carrier.

FIG. 6A is a block diagram of the elements of the invention which can be practiced in analog form or in digital form with digital signal processor (DSP) blocks. These elements are an IF amplifier 100 which receives an angle modulated carrier signal, feature detector 102, a reference generator 104 and a processor 106. In one embodiment of the present invention, the feature detector 102 recognizes a particular condition of the sinusoidal angle modulated carrier and provides a suitable trigger pulse at its output. The reference generator 104 creates a noncoherent, independent periodic reference. The processor 106 associates the output of the reference generator 104 with a value of phase of the reference at times corresponding to the occurrence of the feature of the angle modulated carrier to provide an output message for a phase modulated carrier or a frequency modulated carrier.

Figure 6B:
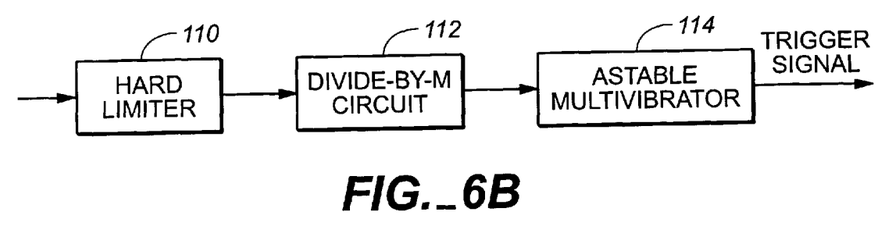
FIG. 6B is a block diagram of a particular feature detector.

FIG. 6B shows one preferred embodiment of the feature detector 102 consisting of a hard limiter 110 having an output coupled to a divide-by-M circuit 112 having output coupled to an astable multivibrator, or one shot 114.

Figure 6C:
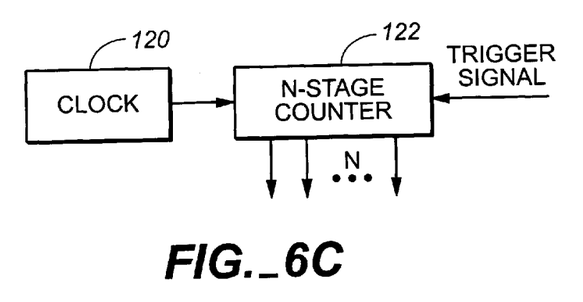
FIG. 6C is a block diagram of a particular reference generator.

FIG. 6C shows one preferred embodiment of the reference generator 104 consisting of a clock 120 having output signal coupled to a counter 122.

Figure 6D:
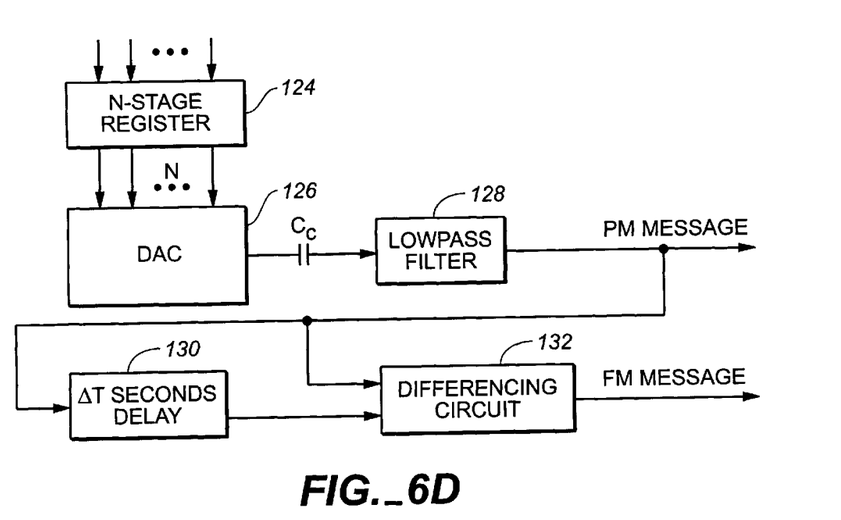
FIG. 6D is a block diagram of a particular processor.

FIG. 6D shows one preferred embodiment of the processor 106 consisting of a register 124 which accepts the output of counter 122 and which has outputs coupled to a digital-to-analog converter DAC 126 which has an output signal coupled through a coupling capacitor $C_C$ and a lowpass filter 128 to a delay circuit 130 and a voltage differencing circuit 132. The voltage differencing circuit 132 compares the delayed signal to the current signal. The output of the voltage differencing circuit 132 is the FM message in the case of FM carriers. The output 124 of the lowpass filter 128 is the PM message in the case of PM carriers.

Figure 6E:
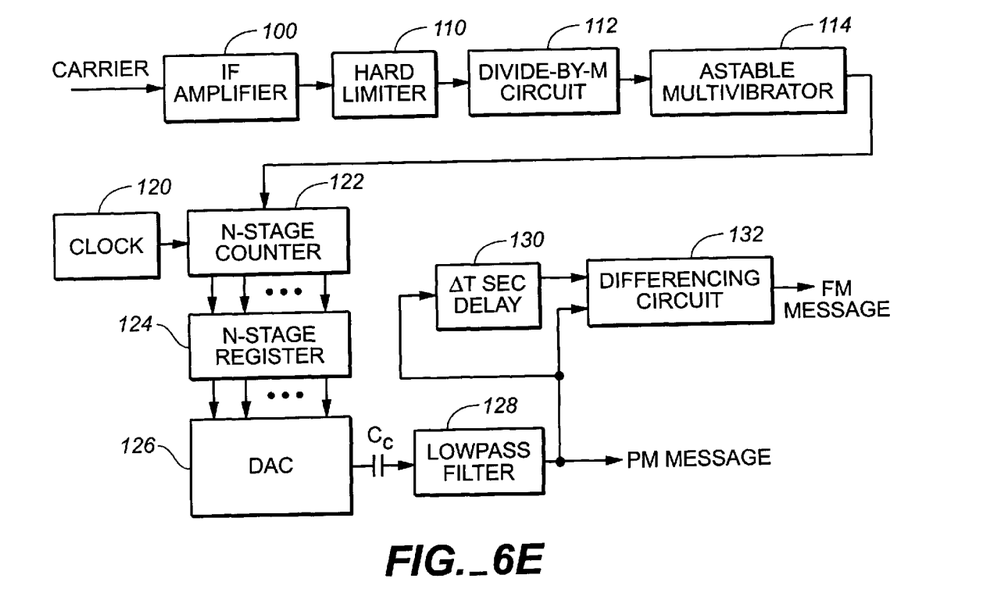
FIG. 6E is a block diagram of an angle demodulator which uses a particular feature detector and a particular processor and is suitable for recovery of the message for a frequency modulated carrier and a phase modulated carrier when phase is determined every M cycles of the modulated carrier where M is a positive integer including 1.

FIG. 6E is a block diagram of one preferred embodiment of the apparatus of the invention. An angle modulated carrier is down converted in a superheterodyne radio receiver and applied to an input terminal of the intermediate frequency (IF) amplifier 100. In a preferred embodiment of the present invention, the hard limiter 110 converts the sinusoidal angle modulated carrier signal to an angle modulated two-level voltage (square wave) provided at an output terminal thereof. The divide-by-M circuit 112 provides an output signal every M cycles of its two-level input. The astable multivibrator, or one shot, 114 provides a suitable voltage trigger pulse at an output terminal at each positive-going or negative-going transition of the output of the divide-by-M circuit. When M=1, then the output of the hard limiter 110 is applied directly to the input of the astable multivibrator. The clock source 120, such as an oscillator, provides clock pulses at a regular rate at an output terminal. The frequency of the clock pulse signal differs from that of the unmodulated carrier by $f_B$ Hz. It is preferred, but not necessary, that $f_B \approx 0$ Hz. The clock pulses are counted by the counter 122. When the output of the one shot 114 occurs, the contents of the stages of the counter 122 are transferred to the register 124. The contents of the register 124 are converted to one of $2^N$ voltage step values by a digital-to-analog converter (DAC) 126. The output signal of the DAC 126 has an output voltage value which is held until the next readout of the counter 122 occurs. This output voltage value is linearly related to the phase of the modulated carrier by virtue of the linear relation between voltage and phase of the periodic sawtooth reference and the known zero value of phase of the angle modulated carrier at the time of occurrence of its detected zero voltage value feature.

The DC voltage component of the voltage value of the output of the DAC 126 is removed by the coupling capacitor $C_C$ which is connected to the lowpass filter 128. Voltage inversion by the lowpass filter 128 provides a faithful representation of the analog phase modulation of the carrier signal. If the linear portion of the sawtooth periodic reference has a negative slope, then the voltage inversion is not necessary.

The PM message signal is delayed by the delay circuit 130 to provide one input to the differencing circuit 132. The other input to the differencing circuit 132 is the PM message signal. The output signal of the differencing circuit 132 is the FM message.

Figure 7A:
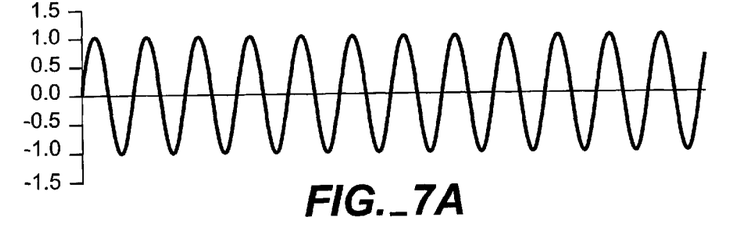
FIG. 7A is a plot of an angle modulated sinusoidal carrier.
Figure 7B:
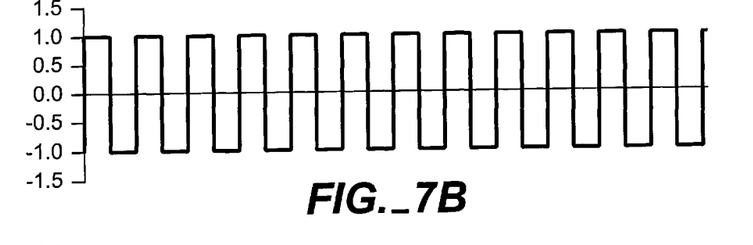
FIG. 7B is a plot of the output signal of a hard limiter having as its input the waveform of FIG. 7A.
Figure 7C:
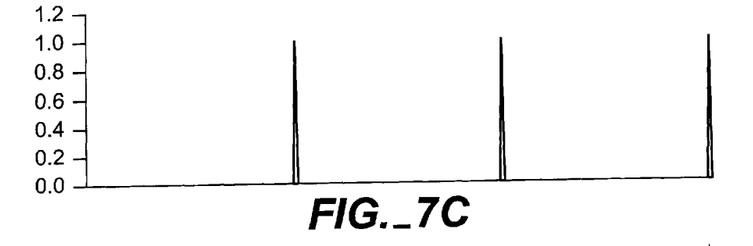
FIG. 7C is a plot of the output of a one-shot multivibrator having as an input signal the output signal of a divide-by-M circuit when M=4 and when the input signal to the divide-by-M circuit is the waveform of FIG. 7B.
Figure 7D:
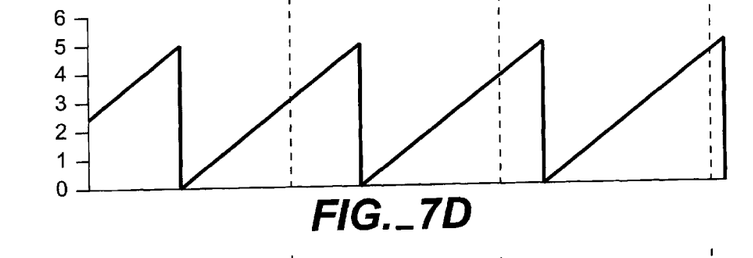
FIG. 7D is a plot of the output of a digital circuit used to generate a sawtooth voltage.
Figure 7E:
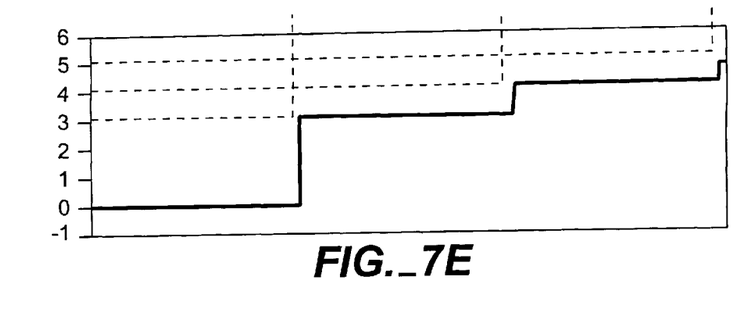
FIG. 7E is a plot of the sampled and held output of a digital-to-analog converter having as an input signal the digital contents of a register.

FIGS. 7A–7E illustrate signal waveforms associated with the system of FIG. 6E. Time increases to the right in these Figures. FIG. 7A shows a carrier having phase modulation where the intervals between adjacent zero values of the carrier increase linearly with time for the example of FIGS. 7A–7E. FIG. 7B shows the hard limited version of the carrier signal at the output terminal of the hard limiter 110. FIG. 7C shows the output signal of the one shot 114 which is triggered every fourth instantaneous period of the waveform of FIG. 7B. That is, M=4 for the divide-by-M circuit 112 in this example. FIG. 7D shows the waveform of the periodic reference signal. FIG. 7E shows the sampled and held analog voltage equivalent to the contents of the register 124. Sample values of the discrete sawtooth voltage increase from about 3.3 volts to about 4.4 volts. Removal of any DC, lowpass filtering and voltage inversion provides a faithful representation of the analog phase modulation of the carrier according to the description of the operation of the circuit of FIG. 6E.

Various reasons may result in choice of this preferred embodiment involving a phase measurement every M instantaneous periods of the modulated carrier. These include the following: First, the number of samples of the message may be much greater than required by the Nyquist sampling theorem. Second, sampling the phase less often permits the clock rate to be reduced by a factor of M. That is, one period of the periodic reference can now extend over M periods of the unmodulated carrier (at the intermediate frequency). Third, sampling the phase less often permits larger values of intermediate frequency for the same clock rate. Fourth, sampling the phase every M instantaneous periods of the modulated carrier is equivalent to averaging M cycles of the modulated carrier. This provides immunity to the effects of noise.

Figure 8:
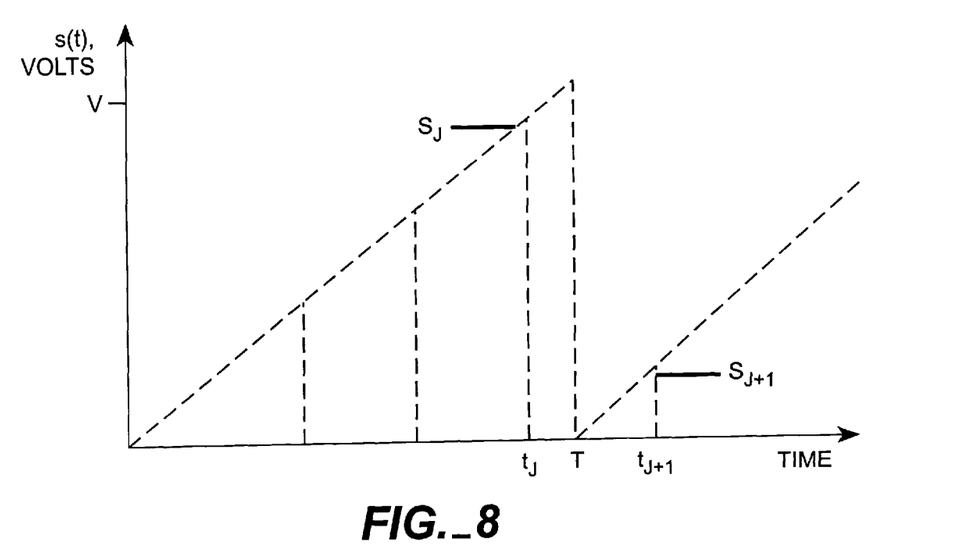
FIG. 8 is a diagram illustrating the flyback condition for samples whose values increase with time.

In FIG. 6E, the sawtooth voltage (count) created by the counter goes from an all ones count to an all zeroes count, corresponding to a change from 360 degrees to 0 degrees at the end of each period of the sawtooth. This flyback effect needs to be accommodated when determining the true relative phase (or change in phase) of the modulated carrier and the reference. In a preferred embodiment of the invention, it is necessary to remove this flyback effect from the result of interest. Consider the counter output as a sawtooth voltage s(t). Let $s_J$ represent the jth sample value of said voltage where j is a positive integer. Two conditions involving the flyback voltage can exist. The first is when the sample values are increasing such that $s_J$ is near the peak of the sawtooth voltage and $s_{J+1}$ is a much smaller value. See FIG. 8. The voltage change between these sample values is $[(V-s_J)+s_{J+1}]$ as shown in FIG. 8 where V is the peak value of the sawtooth voltage. Note that this true difference of $s_{J+1}$ and $s_J$ is >0 volts.

Figure 9:
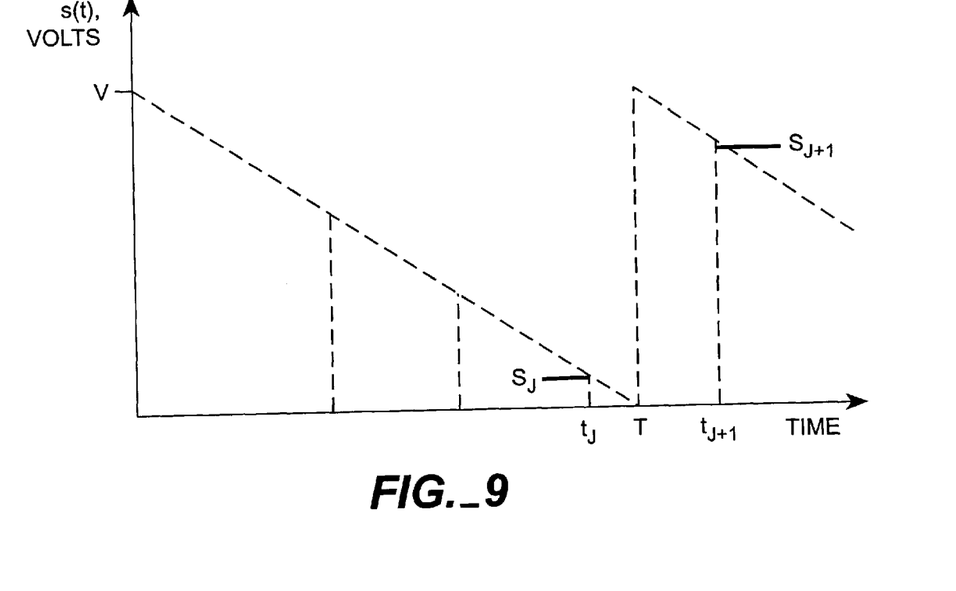
FIG. 9 is a diagram illustrating the flyback condition for samples whose values decrease with time.

The second condition is when the sample values are decreasing such that $s_J$ is near zero and $s_{J+1}$ is near a peak value of the sawtooth voltage as shown in FIG. 9. The true change in voltage is now $[(s_{J+1}-V)-s_J]$ which is less than 0 volts.

To overcome the effect of the sawtooth flyback, form the change in sample values using the formulas just derived for the flyback end points. We now have an indication of the change in voltage from one sample value to the next independent of the flyback. These voltage differences are the desired output voltage samples when demodulating FM carriers. For PM, we want the true sample values. These can be formed from the difference in voltage at the flyback end points by the recursion relation $s_{J+1}=s_J+$(the difference value $s_{J+1}-s_J$ previously obtained).

Alternatively, the flyback conditions can be accommodated by associating a principal value of phase in the region 0 to 360 degrees with the voltage samples. For example, in FIGS. 8 and 9, let 0 volts correspond to 0 degrees and V volts to 360 degrees. The change in phase from one voltage sample to the next is then readily calculable by a variety of well known methods.

For purposes of this invention, by signal is meant a signal voltage or an equivalent digital representation of a signal. Processing of the various signals is accomplished with appropriate analog signal processing apparatus, digital signal processing (DSP) apparatus, which includes programmable processors, or a combination of both types of signal processing. Note that the periodic reference is provided as a discrete analog signal or as a digital representation of a discrete signal.

While the present invention has been particularly shown and described with respect to certain preferred embodiments thereof, it should be readily apparent to those of ordinary skill in the art that various changes and modifications in form and detail may be made without departing from the spirit and scope of the invention as set forth in the appended claims. Digital signal processing (DSP) circuits can be used to accomplish the required result as described in the invention. Also, circuitry may be simplified when other prior information about the carrier modulation and any possible relations thereof are known. The invention can be used when bit streams are filtered or shaped prior to carrier modulation. The invention illustratively disclosed herein may be practiced in the absence of any element which is not specifically disclosed herein. The invention is not limited to the embodiments disclosed herein and may be practiced using other techniques such as, for example, DSP or software implementations of circuit or system functions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of demodulating an angle modulated carrier signal which is angle modulated with a message signal, comprising the steps of:

generating a noncoherent, independent, periodic reference having a predetermined phase characteristic, which phase characteristic is noncoherent with and independent of the phase of the angle modulated carrier signal;

determining the phase of the noncoherent, independent, periodic reference;

determining the phase of the angle modulated carrier signal;

comparing the phase of the angle modulated carrier signal with the phase of the noncoherent, independent, periodic reference to determine the message signal on the angle modulated carrier signal; and wherein the step of determining the phase of the noncoherent, independent, periodic reference includes associating the phase of the noncoherent, independent, periodic reference with the contents of a counter and wherein the step of determining the phase of the angle modulated carrier signal includes associating the phase of the angle modulated carrier signal with a voltage value for the angle modulated carrier signal.

2. The method of claim 1 wherein the step of generating the noncoherent, independent, periodic reference includes generating the noncoherent, independent, periodic reference with an oscillator which is not synchronized with the angle modulated carrier signal.

3. The method of claim 1 wherein the step of comparing the phase of the angle modulated carrier signal with the phase of the noncoherent, independent, periodic reference to determine the modulation on the angle modulated carrier signal provides time variations which are related to the message signal for a PM carrier.

4. The method of claim 1 wherein the step of comparing the phase of the angle modulated carrier with the phase of the noncoherent, independent, periodic reference to determine the modulation on the angle modulated carrier signal provides changes in time variations which are related to the message signal for a FM carrier.

5. The method of claim 1 wherein the step of associating the phase of the independent, periodic reference with the contents of a counter includes generating the noncoherent, independent, periodic reference having a predetermined phase characteristic, which phase characteristic is noncoherent with and independent of the phase of the angle modulated carrier signal.

6. The method of claim 1 further including:

measuring the voltage value of the modulated carrier signal;

measuring the contents of the counter which represent the independent periodic reference; and comparing the measured value of voltage of the modulated carrier signal with the phase of the independent periodic reference to determine the message signal on the modulated carrier signal, such that the time variation of said comparison is directly related to the message signal in the case of a PM carrier signal.

7. The method of claim 1 further including:

measuring the voltage value of the modulated carrier signal;

measuring the contents of the counter which represent the phase of the independent, periodic reference; and comparing the measured value of voltage of the modulated carrier signal with the measured value of phase of the independent periodic reference to determine the modulation on the modulated carrier signal, such that the change in time variation of said voltage comparison is related to the message signal in the case of a FM carrier signal.

8. The method of claim 1 wherein the step of determining the phase of the angle modulated carrier includes determining the phase of the angled modulated carrier signal every M cycles of the angle modulated carrier signal.

9. A method of demodulating an angle modulated carrier which is angle modulated with a message signal, comprising the steps of:

generating a sawtooth variation as a noncoherent, independent, periodic reference having a predetermined phase characteristic, which is noncoherent with and independent of the angle modulated carrier;

associating the phase of the modulated carrier with a voltage value of the modulated carrier and determining the phase of the noncoherent, independent, periodic reference by measuring the voltage value of the modulated carrier;

associating the phase of the independent periodic reference with a voltage value of the modulated carrier and determining the phase of the angle modulated carrier by measuring the phase of the independent periodic reference; and comparing the phase of the angle modulated carrier with the phase of the noncoherent, independent, periodic reference to determine the message signal on the angle modulated carrier.

10. The method of claim 9 wherein the step of comparing the phase of the angle modulated carrier with the phase of the noncoherent, independent, periodic reference to determine the message signal on the angle modulated carrier includes the step of directly relating the time variations of the comparison to the message signal for a PM carrier.

11. The method of claim 9 wherein the step of comparing the phase of the angle modulated carrier with the phase of the noncoherent, independent, periodic reference to determine the message signal on the angle modulated carrier includes the step of relating the changes of the time variations of the comparison to the message signal for a FM carrier.

12. The method of claim 9 wherein the step of generating a sawtooth variation as a noncoherent, independent, periodic reference having a predetermined phase characteristic, which is noncoherent with and independent of the angle modulated carrier, includes counting a reference clock signal and converting the count value to a level of the sawtooth variation.

13. The method of claim 9 including the steps of:
converting the modulated carrier signal to a form wherein its zero values are readily identified; and
measuring the value of the independent periodic reference at occurrences of the zero values of the modulated carrier signal.

14. The method of claim 13 including the steps of:
hard limiting the modulated carrier to provide a modulated two-level voltage signal; and
detecting the zero value of said modulated two-level voltage signal to obtain the occurrences of the zero values of the modulated carrier signal.

15. The system of claim 14 further including the step of:
counting a reference clock signal and converting the count value to discrete values of the sawtooth reference;
detecting the zero value of the modulated two-level voltage signal with an astable multivibrator having an output signal at zero values of the modulated two-level voltage input; and
transferring the count of the reference clock signal to a processor using the output signal of the astable multivibrator.

16. The method of claim 9 wherein the step of determining the phase of the angle modulated carrier signal includes determining the phase of the angled modulated carrier signal every M cycles of the angle modulated carrier signal.

17. A method of demodulating an angle modulated carrier which is angle modulated with a message signal, comprising the steps of:
generating a sawtooth variation as a noncoherent, independent, periodic reference having a predetermined phase characteristic, which is noncoherent with and independent of the angle modulated carrier;
associating the phase of the modulated carrier with a zero voltage value of the modulated carrier and determining the phase of the noncoherent, independent, periodic reference at occurrences of the zero values of the modulated carrier signal;
associating the phase of the independent periodic reference with a zero voltage value of the modulated carrier and determining the phase of the angle modulated carrier by measuring the phase of the independent periodic reference; and
associating the phase of the angle modulated carrier with the phase of the noncoherent, independent, periodic reference to determine the message signal on the angle modulated carrier.

18. The method of claim 17 wherein the step of associating the phase of the angle modulated carrier with the phase of the noncoherent, independent, periodic reference to determine the message signal on the angle modulated carrier includes the step of directly relating the time variations of the comparison to the message signal for a PM carrier.

19. The method of claim 17 wherein the step of associating the phase of the angle modulated carrier with the phase of the noncoherent, independent, periodic reference to determine the message signal on the angle modulated carrier includes the step of relating the changes of the time variations of the comparison to the message signal for a FM carrier.

20. The method of claim 17 further including the step of:
counting the reference clock signal and converting the count to discrete values of the sawtooth reference;
detecting the zero value of the modulated two-level voltage signal with an astable multivibrator having an output signal at zero values of the modulated two-level voltage input; and
transferring the counts of the reference clock signal to a processor using the output signal of the astable multivibrator.

21. The method of claim 17 wherein the step of determining the phase of the angle modulated carrier signal includes determining the phase of the angled modulated carrier signal every M cycles of the angle modulated carrier signal.

22. The method of claim 17 wherein measurements of voltage are taken every M occurrences of an instantaneous period of the modulated carrier, comprising the steps of:
counting M instantaneous periods of the modulated carrier; and
reading the contents of the counter used to form the independent periodic reference at the end of each group of M instantaneous periods of the modulated carrier.

23. A system for recovering a message signal from an angle modulated carrier signal, comprising:
a hard limiter having an input terminal for receiving the angle modulated carrier signal and having an output terminal for providing a hard limited signal;
a divide-by-M circuit coupled to the output terminal of the hard limiter and having an output terminal coupled to the astable multivibrator where M is a positive integer including 1;
an astable multivibrator having an input terminal coupled to the output terminal of the hard limiter and having an output terminal at which is provided an output signal at times corresponding to zero values of the angle modulated carrier;
a clock having an output terminal at which is provided voltage level changes applied to a counter;
a counter having a number of counter stages with output terminals and having a clock input terminal for receiving the reference clock signal, such that the counter counts periods of the clock signal and such that the output terminals of the counter stages provide a digital representation of the number of cycles counted by the counter;
a storage register for storing the digital representation of the number of cycles counted by the counter, said storage register having output terminals;
wherein said counter having a command terminal at which is provided the output signal of the astable multivibrator which is used to transfer the contents of the counter to the storage register;
a digital-to-analog converter having input terminals coupled to the output terminals of the storage register and having an output terminal at which is provided a voltage proportional to the count of the counter;
a voltage differencing circuit used to compare a present value and a previous value of the voltage at the output terminal of the digital-to-analog converter when recovering a message from a frequency modulated carriers; and a lowpass filter used to convert the discrete values of voltage at the output terminal of the digital-to-analog converter or said voltage differencing circuit to a continuous voltage when the message on the phase modulated or frequency modulated carrier is analog.

24. The system of claim 23 further including a divide-by-M circuit for dividing the frequency of the output signal of the hard limiter by M where M is a positive integer including 1.

25. A system for recovering a message signal from an angle modulated carrier signal which is angle modulated with a message signal, comprising:

a feature detector for receiving the angle modulated carrier signal and for providing an output pulse at times when particular values of a predetermined feature of the angle modulated carrier signal occur;

a reference generator which provides a noncoherent, independent, periodic reference having a predetermined phase characteristic, which phase characteristic is noncoherent with and independent of the phase of the angle modulated carrier signal; and a processor which compares the phase of the angle modulated carrier signal with the phase of the noncoherent, independent, periodic reference at the times when particular values of the predetermined feature of the angle modulated carrier signal occur and which provides the message signal on the angle modulated carrier signal.

26. The system of claim 25 wherein the feature detector includes a hard limiter followed by an astable multivibrator having an input terminal coupled to the output terminal of the hard limiter and having an output terminal at which is provided an output signal at times corresponding to the feature being zero values of the angle modulated carrier.

27. The system of claim 25 wherein the feature detector further includes a divide-by-M module for dividing the frequency of the output signal of the hard limiter by an integer M.

28. The system of claim 25 wherein the reference generator includes a clock source which provides a periodic pulse signal to a counter which has a plurality of counter stages for providing a sawtooth reference.

29. The system of claim 28, wherein the processor includes:

a register having a plurality of register stages for storing respective contents of the counter stages in response to receipt of the output pulse of the feature detector; and a digital-to analog converter having input terminals coupled to respective ones of the plurality of register stages and having an output terminal at which is provided a discrete signal corresponding to the phase difference between the angle modulated carrier signal and the reference generator.

30. The system of claim 29, wherein the processor further includes a coupling capacitor connected to the output terminal of the digital-to analog converter and followed by a lowpass filter having an output terminal at which is provided a PM message output signal from the angle modulated carrier signal.

31. The system of claim 30 including:

a delay circuit for receiving the PM message output signal from the output terminal of the lowpass filter and for providing a delayed PM message output signal; and a differencing module which receives the PM message output signal and the delayed PM message output signal to provide a FM message output terminal from the angle modulated carrier signal.

32. The system of claim 25 wherein the processor includes digital signal processor (DSP) integrated circuitry.

33. A method of demodulating an angle modulated carrier signal which is angle modulated with a message signal, comprising the steps of:

detecting feature of the angle modulated carrier signal and providing an output pulse at times when particular values of a predetermined feature of the angle modulated carrier signal occur;

generating a noncoherent, independent, periodic reference having a predetermined phase characteristic, which phase characteristic is noncoherent with and independent of the phase of the angle modulated carrier signal; and comparing the phase of the angle modulated carrier signal with the phase of the noncoherent, independent, periodic reference at the times when particular values of the predetermined feature of the angle modulated carrier signal occur to provide the message signal on the angle modulated carrier signal.

34. The method of claim 33 wherein the step of detecting the feature of the angle modulated carrier includes hard limiting the angle modulated carrier and providing the output pulse at times corresponding to the feature being zero values of the angle modulated carrier.

35. The method of claim 34 including the step of dividing the frequency of the output signal of the hard limiter by an integer M.

36. The method of claim 33 wherein the step of generating the noncoherent, independent, periodic reference having a predetermined phase characteristic includes counting reference clock pulses to provide a count value representing a sawtooth reference.

37. The method of claim 36 wherein the step of comparing the phase of the angle modulated carrier signal with the phase of the noncoherent, independent, periodic reference signal at times when particular values of the predetermined feature of the angle modulated carrier signal occur includes:

storing the count values in response to detection of a feature of the angle modulated carrier signal; and converting the stored count values with a digital-to analog converter to discrete signal levels corresponding to the phase difference between the angle modulated carrier signal and the reference generator.

38. The method of claim 37 including the steps of coupling the discrete signal levels through a coupling capacitor to a lowpass filter to provide a PM message output signal from the angle modulated carrier signal.

39. The method of claim 38 including the steps of:

delaying the PM message output signal to provide a delayed PM message output signal; and taking the difference between the delayed PM message output signal and the PM message output signal to provide a FM message output signal.

40. The method of claim 33 wherein the step of comparing the phase of the angle modulated carrier signal with the phase of the noncoherent, independent, periodic reference includes using digital signal processing (DSP).

* * * * *